United States Patent
Huang et al.

(10) Patent No.: US 9,374,089 B2
(45) Date of Patent: Jun. 21, 2016

(54) ISOLATION CELL

(75) Inventors: Shen-Yu Huang, Jhubei (TW); Peng-Chuan Huang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 599 days.

(21) Appl. No.: 13/311,324

(22) Filed: Dec. 5, 2011

(65) Prior Publication Data

US 2013/0140905 A1 Jun. 6, 2013

(51) Int. Cl.
| | |
|---|---|
| *H04B 3/00* | (2006.01) |
| *H04B 15/00* | (2006.01) |
| *H05K 9/00* | (2006.01) |
| *H03K 19/00* | (2006.01) |
| *G06F 1/26* | (2006.01) |
| *G06F 1/32* | (2006.01) |

(52) U.S. Cl.
CPC .............. *H03K 19/0008* (2013.01); *G06F 1/26* (2013.01); *H03K 19/0016* (2013.01); *G06F 1/32* (2013.01)

(58) Field of Classification Search
CPC .............. H03L 5/00; G06F 1/28; G06F 1/32; G06F 1/26; H03K 17/16; H03K 19/0175
USPC ......... 307/89, 80, 82; 713/322, 300; 327/333, 327/407; 326/21, 62
See application file for complete search history.

(56) References Cited

U.S. PATENT DOCUMENTS

| | | | | |
|---|---|---|---|---|
| 7,167,017 B2 * | 1/2007 | Arora ................. | H03K 19/0016 | 326/21 |
| 2008/0082840 A1 * | 4/2008 | Kendall ................ | G06F 1/3203 | 713/300 |
| 2009/0039462 A1 | 2/2009 | Huang | | |
| 2009/0251185 A1 | 10/2009 | Wu et al. | | |
| 2010/0153759 A1 * | 6/2010 | Singhal ................. | G06F 1/3203 | 713/322 |
| 2010/0275051 A1 * | 10/2010 | Searles ...................... | G06F 1/28 | 713/330 |
| 2012/0187998 A1 * | 7/2012 | Jarrar ............. | H03K 19/018521 | 327/333 |

FOREIGN PATENT DOCUMENTS

| | | |
|---|---|---|
| CN | 1536577 | 10/2004 |
| CN | 101059716 | 10/2007 |
| CN | 101251870 | 8/2008 |

(Continued)

OTHER PUBLICATIONS

Zhu, Jian-Ming: "One Kind of New Design in Isolation Amplifier"; Copyright 1994-2006 China Academic Journal Electronic Publishing House; pp. 177-178.
Full English (machine) translation of CN101251870 (Published Aug. 27, 2008).
Full English (machine) translation of CN101697094 (Published Apr. 21, 2010).

(Continued)

*Primary Examiner* — Rexford Barnie
*Assistant Examiner* — Jagdeep Dhillon
(74) *Attorney, Agent, or Firm* — McClure, Qualey & Rodack, LLP

(57) ABSTRACT

An embodiment of the invention provides an isolation cell for isolating a second power domain from a first power domain. The isolation cell includes an input terminal capable of receiving a first signal of the first power domain, an output terminal capable of outputting an output signal with a predetermined logic state to the second power domain, a first power terminal and a second power terminal. The first power terminal is capable of receiving a voltage from a power source, the power source is different from a first power source of the first power domain, and the isolation cell is powered by the voltage.

19 Claims, 3 Drawing Sheets

(56) References Cited

FOREIGN PATENT DOCUMENTS

| CN | 101364445 | 2/2009 |
|---|---|---|
| CN | 101697094 | 4/2010 |

OTHER PUBLICATIONS

Full English (machine) translation of CN1536577 (Published Oct. 13, 2004).

* cited by examiner

ISOLATION CELL

BACKGROUND OF THE INVENTION

1. Field of the Invention

The invention relates to an isolation cell, and more particularly to an isolation cell using an independent power source.

2. Description of the Related Art

A circuit often includes a plurality of power domains, wherein each power domain may operate in different power voltage modes. For example, there may be one power domain operated in a power voltage-down mode (e.g. no supply of power voltage), while the other power domains are operated in a power voltage-on mode. This can help reduce power consumption. However, a power domain in a power voltage-down mode may provide an input to the power domains in a power voltage-on mode, wherein the input from the power voltage-down power domain may be in an unknown state, which would cause the power domains in the power voltage-on mode to operate abnormally. Therefore, an isolation cell capable of controlling an unknown signal from a power voltage-down power domain to be at a predetermined state is desired.

BRIEF SUMMARY OF THE INVENTION

An embodiment of the invention provides an isolation cell for isolating a second power domain from a first power domain. The isolation cell includes an input terminal capable of receiving a first signal of the first power domain, an output terminal capable of outputting an output signal with a predetermined logic state to the second power domain, a first power terminal and a second power terminal. The first power terminal is capable of receiving a voltage from a power source, the power source is different from a first power source of the first power domain, and the isolation cell is powered by the voltage.

Another embodiment of the invention provides an integrated circuit to provide an output signal to a second power domain. The integrated circuit includes a first power domain and an isolation cell. The isolation cell is capable of receiving a first signal of the first power domain and outputs the output signal with a predetermined logic state, wherein the isolation cell is powered by a second power source which is different from a first power source of the first power domain.

Another embodiment of the invention provides an integrated circuit. The integrated circuit includes a first power domain, a second power domain and an isolation cell. The first power domain is powered by a first power source. The second power domain is powered by a second power source, wherein the first power domain is operated in a power down mode or a power on mode, and the second power domain is operated in a power on mode. The isolation cell is powered by a third power source and is capable of receiving a signal from the first power domain to output an output signal with a predetermined logic state to the second power domain.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
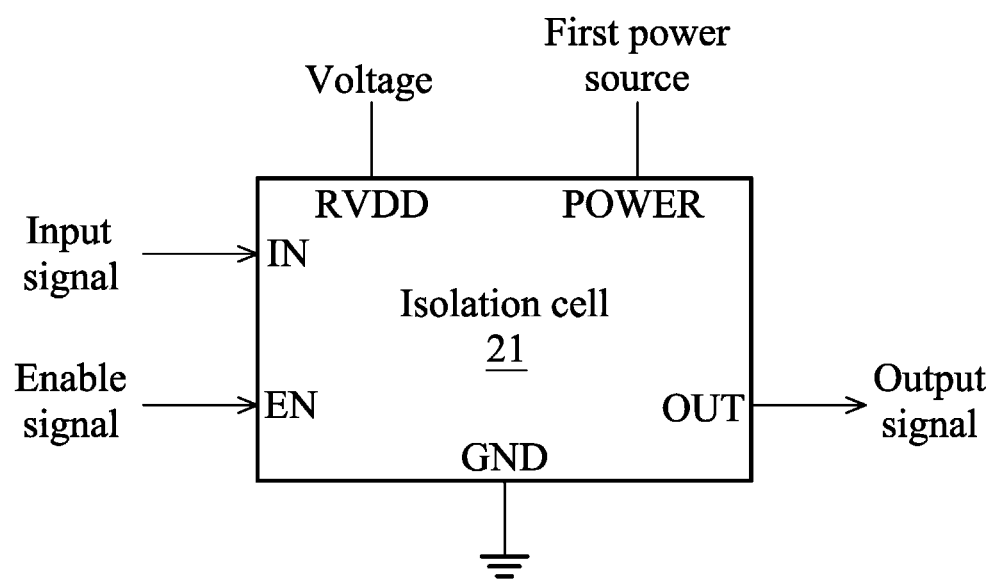
FIG. 1 is a schematic diagram of an isolation cell according to one embodiment of the invention.

FIG. 1 is a schematic diagram of an isolation cell according to one embodiment of the invention. The isolation cell 21 is for isolating a second power domain from a first power domain. The isolation cell 21 can keep the output signal of the isolation cell 21 to be at a predetermined logic state. The first power domain can be a power down power domain and the second power domain can be a power on power domain. In another embodiment, the first power domain can be another power on power domain. The isolation cell 21 can be disposed in the first power domain, between the first and second power domains, or in the second power domain. In the present application, the power domain includes at least one module, circuit, a portion of circuit, or element that shares the same power source, wherein the power source may provide at least one voltage level to the circuits, modules or elements within the power domain. The at least one module, circuit, a portion of circuit or element in the same power domain can be turned on or off together. In one embodiment, the power domain can be regarded as one processing unit, module, circuits, a portion of circuit or a combination of portions of different circuits.

The isolation cell 21 includes an input terminal (labeled as IN) capable of receiving an input signal from the first power domain and an output terminal (labeled as OUT) capable of outputting an output signal with a predetermined logic state to the second power domain. The first power domain can be powered by a first power source. The isolation cell 21 further includes a ground terminal (labeled as GND) capable of grounding, a power terminal (labeled as POWER) coupled to the first power source and an independent power terminal (labeled as RVDD) capable of receiving a voltage from a second power source which is capable of maintaining the voltage at a predetermined voltage level. The isolation cell 21 can be coupled to the first power source via the power terminal (labeled as POWER) to prevent the circuit path containing the isolation cell 21 from opening. The isolation cell 21 can bypass the power terminal (labeled as POWER) coupled to the first power source, thus is not affected by the first power source. The isolation cell 21 can be powered by the voltage from the second power source. The second power source is different from the first power source. In the conventional design, the isolation cell is included in the circuit of the first power domain and may be only powered by the first power source. When the first power source does not power the isolation cell, the logic level of the output signal of the isolation cell cannot be maintained at the predetermined logic level, and this may affect the operation of circuit of the second power domain. According to this embodiment, the output signal of the isolation cell 21 can be at a predetermined logic state and would not be affected by the first power source. The independent power terminal (RVDD) of isolation cell 21 can ensure the isolation cell 21 works normally. In other words, the output signal of the isolation cell 21 can be at a predetermined logic state even when the first power domain is in a power down mode.

The isolation cell 21 further includes an enable terminal (labeled as EN) capable of receiving an enable signal for controlling the logic state of the output signal of the isolation cell 21. The logic state of the output signal is determined by a logic state of the enable signal. In one embodiment, the isolation cell 21 can be implemented by an AND gate, and when the logic state of the enable signal is logic 0, the logic state of the output signal of the isolation cell 21 can be logic 0 regardless of the logic state of the input signal. In another embodiment, the isolation cell 21 includes an OR gate, and when the logic state of the enable signal is logic 1, the logic state of the output signal of the isolation cell 11 can be logic 1 regardless of the logic state of the input signal. In other embodiments, the isolation cell 11 can include NOR gate, NAND gate or any other component capable of controlling the logic state of the output signal of the isolation cell 21.

Figure 2:
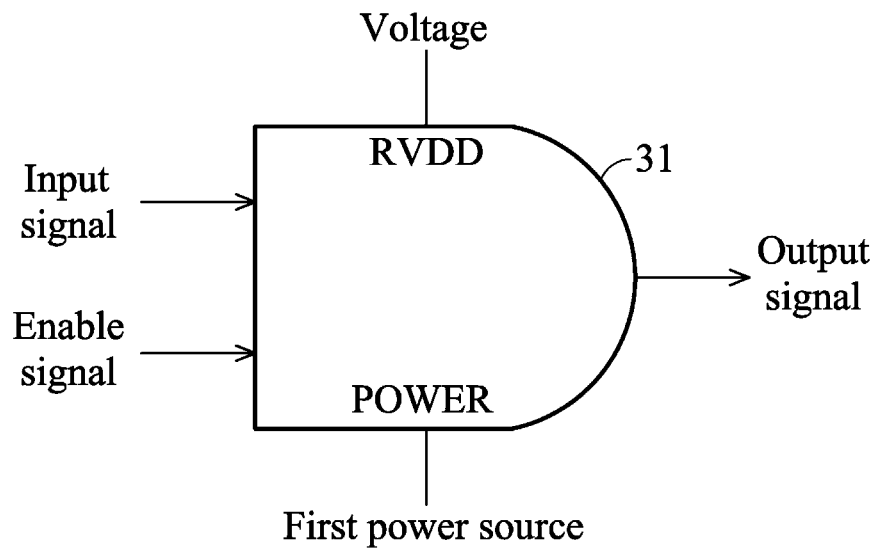
FIG. 2 is a schematic diagram of an example of an integrated circuit illustrating an implementation of the isolation cell according to the invention.

In FIGS. 2-5, for simplicity, the ground terminal is not shown. FIG. 2 is a schematic diagram of an example of an integrated circuit illustrating an implementation of the isolation cell according to the invention. In FIG. 2, the isolation cell 31 is illustrated with an AND gate. The isolation cell 31 is capable of receiving an input signal from a first power domain and outputting an output signal to a second power domain. The isolation cell 31 can have one power terminal (labeled as POWER) coupled to a first power source and the other power terminal (labeled as RVDD) capable of receiving a voltage from a second power source. The isolation cell 31 can be coupled to the first power source via the power terminal (labeled as POWER) to prevent the circuit path containing the isolation cell 31 from opening. The isolation cell 31 can bypass the power terminal (labeled as POWER) coupled to the first power source, thus is not affected by the first power source. The isolation cell 31 can be powered by the voltage from the second power source. The second power source is different from the first power source. The isolation cell 31 is capable of receiving an enable signal with a logic state of 0, thus the logic state of the output signal can be kept at logic 0 and the logic state of the output signal is not affected by the logic state of the input signal.

Figure 3:
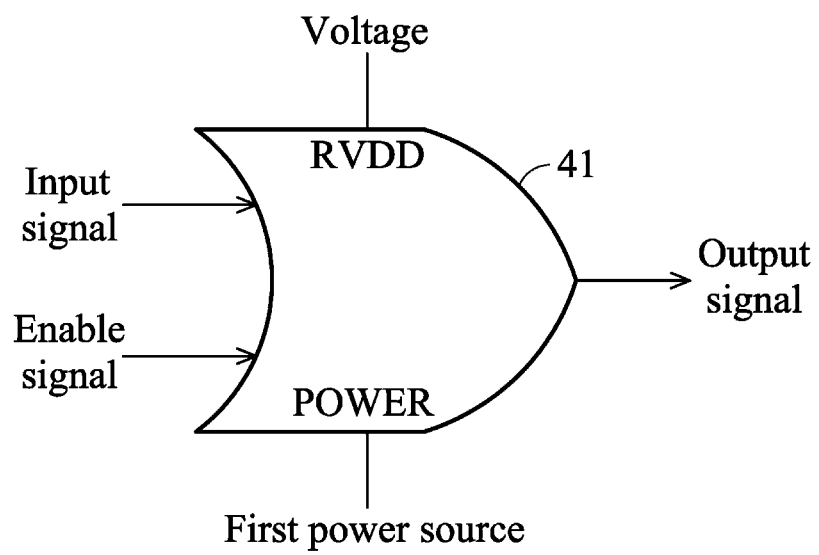
FIG. 3 is a schematic diagram of another example of an integrated circuit illustrating an implementation of the isolation cell according to the invention.

FIG. 3 is a schematic diagram of another example of an integrated circuit illustrating an implementation of the isolation cell according to the invention. In FIG. 3, the isolation cell 41 is illustrated with an OR gate. The isolation cell 41 is capable of receiving an input signal from a first power domain and outputting an output signal to a second power domain. The isolation cell 41 can have one power terminal (labeled as POWER) coupled to a first power source and the other power terminal (labeled as RVDD) capable of receiving a voltage from a second power source. The isolation cell 41 can be coupled to the first power source via the power terminal (labeled as POWER) to prevent the circuit path containing the isolation cell 31 from opening. The isolation cell 41 can bypass the power terminal (labeled as POWER) coupled to the first power source, thus is not affected by the first power source. The isolation cell 41 can be powered by the voltage from the second power source. The second power source is different from the first power source. In the embodiments shown in FIGS. 2-4, a power source is different from the other can mean that the two power sources can be controlled independently. For example, the second power source can be an always-on power source while the first power source can include a switch to cut off power supply to the first power domain. The power sources can be of the same voltage or not, and the power sources can originate from the same power supply. The isolation cell 41 is capable of receiving an enable signal with a logic state of 1, thus the logic state of the output signal can be kept at logic 1 and the logic state of the output signal is not affected by the logic state of the input signal.

Figure 4:
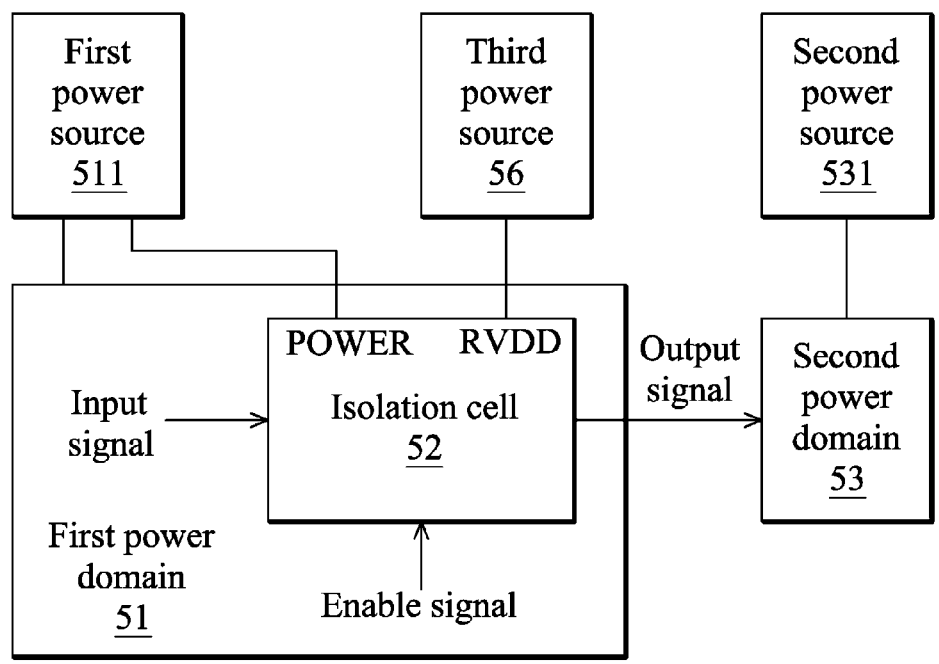
FIG. 4 is a schematic diagram of an integrated circuit with an isolation cell according to another embodiment of the invention.

FIG. 4 is a schematic diagram of an integrated circuit with an isolation cell according to an embodiment of the invention. In this embodiment, the isolation cell 52 is integrated inside of the first power domain 51. The first power domain 51 may be operated in a power down mode or a power on mode, and the second power domain 53 can be operated in a power on mode. The power down mode can indicate that the power domain is not powered by a voltage, or say shut down, and the function of circuits in the power domain may not operate normally. The power on mode can indicate that the power domain is powered by a voltage and the function of circuits in the power domain operates normally. The integrated circuit includes the first power domain 51, the isolation cell 52, the second power domain 53, and an independent power source (third power source) 46. The first power domain 51 can be powered by a first power source 511, the second power domain 53 can be powered by a second power source 531, and the isolation cell 52 can be powered by the independent third power source 56 through the independent power terminal (labeled as RVDD). The isolation cell 52 can have the other power terminal (labeled as POWER) coupled to the first power source 511. The isolation cell 52 can be coupled to the first power source 511 via the power terminal (labeled as POWER) to prevent the circuit path containing the isolation cell 52 from opening. The isolation cell 52 can bypass the power terminal (labeled as POWER) coupled to the first power source 511, thus is not affected by the first power source 511. The third power source 56 is different from the first power source 511. Here a power source is different from the other can mean that the two power sources can be controlled independently. For example, the third power source 56 can be an always-on power source while the first power source 511 can include a switch to cut off power supply to the first power domain 51. The power sources can be of the same voltage or not, and the power sources can originate from the same power supply. The third power source 46 is capable of always providing a voltage to the isolation cell 52 and the isolation cell 52 then can be an always-on isolation cell. The first power domain 51 is capable of providing an input signal to the isolation cell 52, and the isolation cell 52 is capable of receiving the input signal and outputting an output signal with a predetermined logic state to the second power domain 53. The output signal of the isolation cell 52 can be affected by an enable signal injected to the isolation cell 52. In one embodiment, the isolation cell 52 may be implemented by an AND gate, and the logic state of the enable signal can be logic 0. In another embodiment, the isolation cell 52 may include an OR gate, and the logic state of the enable signal can be logic 1. In this embodiment, a level shifter may be applied between the isolation cell 52 and the second power domain 53 to adjust the voltage level of the output signal of the isolation cell 52 to match the requirement of the second power domain 53.

Figure 5:
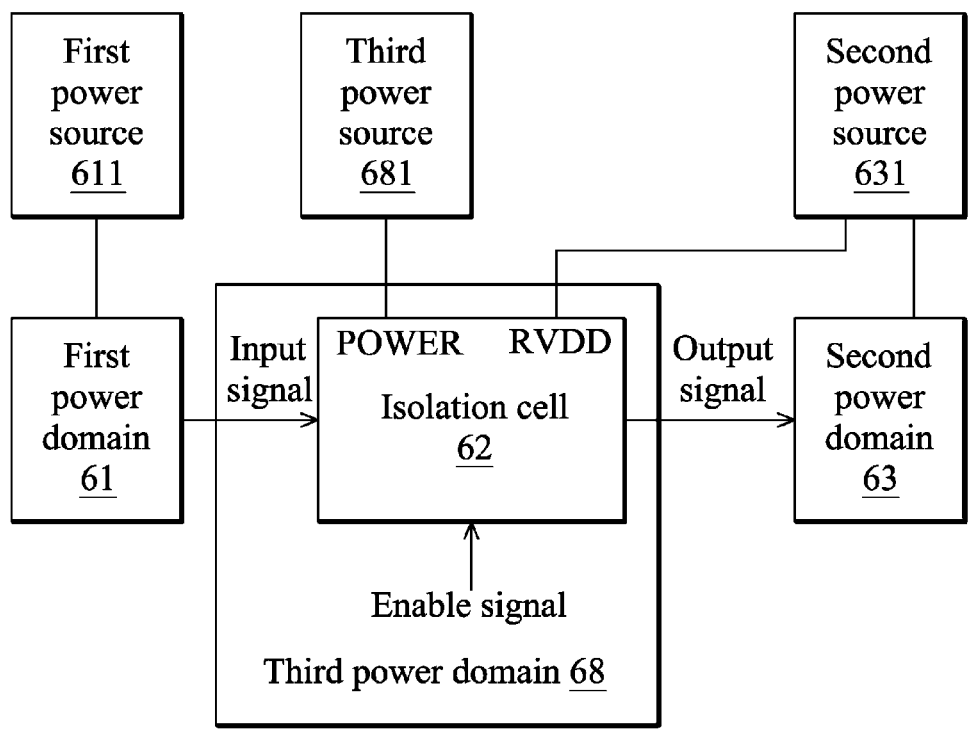
FIG. 5 is a schematic diagram of an integrated circuit with an isolation cell according to another embodiment of the invention.

FIG. 5 is a schematic diagram of an integrated circuit with an isolation cell according to another embodiment of the invention. In this embodiment, the isolation cell 62 is independent from a first power domain 61 and a second power domain 63. The isolation cell 62 is located in a third power domain 68. The first power domain 61 may be operated in a power down mode or a power on mode, and the second power domain 63 may be operated in a power on mode. The integrated circuit includes the first power domain 61, the isolation cell 62, the second power domain 63 and the third power domain 68, wherein the first power domain 61 can be powered by a first power source 611, the second power domain 63 can be powered by a second power source 631, and the third power domain 68 can be powered by a third power source 681. The isolation cell 62 can be powered by a fourth power source or by the second power source 631 through the independent power terminal (labeled as RVDD). The isolation cell 62 can have the other power terminal (labeled as POWER) coupled to the third power source 681. The isolation cell 62 can be coupled to the third power source 681 via the power terminal (labeled as POWER) to prevent the circuit path containing the isolation cell 62 from opening. The isolation cell 62 can bypass the power terminal (labeled as POWER) coupled to the third power source 681, thus is not affected by the third power source 681. The fourth power source or the second power source 631 is different from the first power source 611. Here a power source is different from the other can mean that the two power sources can be controlled independently. For example, the fourth power source can be an always-on power source while the first power source 611 can include a switch to cut off power supply to the first power domain 61. The power sources can be of the same voltage or not, and the power sources can originate from the same power supply. The fourth power source or the second power source 631 can provide a voltage to the isolation cell 62. The first power domain 61 is capable of outputting an input signal to the isolation cell 62, and the isolation cell 62 is capable of receiving the input signal and outputting an output signal with a predetermined logic state to the second power domain 63. The output signal of the isolation cell 62 can be affected by an enable signal injected to the isolation cell 62. In one embodiment, the isolation cell 62 may be implemented by an AND gate, and the logic state of the enable signal can be logic 0. In another embodiment, the isolation cell 62 may include an OR gate, and the logic state of the enable signal can be logic 1. In this embodiment, a level shifter may be applied between the isolation cell 62 and the second power domain 63 to adjust the voltage level of the output signal of the isolation cell 62 to match the voltage requirement of the second power domain 63.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An isolation cell for isolating a second power domain from a first power domain, comprising:
    an input terminal capable of receiving a first signal of the first power domain;
    an output terminal capable of outputting an output signal with a predetermined logic state to the second power domain, wherein the output signal is not affected by the first signal of the first power domain;
    a first power terminal coupled to a power source to receive a voltage; and
    a second power terminal coupled to a first power source of the first power domain to prevent a circuit path containing the isolation cell from opening;
    wherein the isolation cell is powered by the voltage.

2. The isolation cell as claimed in claim 1, wherein the isolation cell is in the first power domain.

3. The isolation cell as claimed in claim 1, wherein the second power terminal is bypassed.

4. The isolation cell as claimed in claim 1, wherein the first power domain is operated in a power on mode or a power down mode, and the second power domain is operated in the power on mode.

5. An isolation cell for isolating a second power domain from a first power domain, comprising:
    an input terminal capable of receiving a first signal of the first power domain;
    an output terminal capable of outputting an output signal with a predetermined logic state to the second power domain;
    a first power terminal coupled to a power source to receive a voltage and the isolation cell is powered by the voltage;
    a second power terminal coupled to a first power source of the first power domain; and
    an enable terminal capable of receiving an enable signal, wherein the logic state of the output signal is the same as a logic state of the enable signal.

6. The isolation cell as claimed in claim 5, wherein the isolation cell comprises an AND gate, and the logic state of the enable signal is logic 0.

7. The isolation cell as claimed in claim 5, wherein the isolation cell comprises an OR gate, and the logic state of the enable signal is logic 1.

8. An integrated circuit to provide an output signal to a second power domain, comprising:
    a first power domain powered by a first power source; and
    an isolation cell capable of receiving a first signal of the first power domain and outputting the output signal with a predetermined logic state, wherein the isolation cell is powered by a second power source which is different from the first power source, and the output signal is not affected by the first signal of the first power domain,
    wherein the isolation cell comprises a first power terminal coupled to the first power source and a second power terminal, the second power terminal is capable of receiving a voltage from the second power source.

9. The integrated circuit as claimed in claim 8, wherein the isolation cell is in the first power domain.

10. The integrated circuit as claimed in claim 8, wherein the first power domain is operated in a power on mode or a power down mode, and the second power domain is operated in the power on mode.

11. The integrated circuit as claimed in claim 8, wherein the isolation cell is further coupled to a third power source different from the second power source.

12. The integrated circuit as claimed in claim 8, wherein the isolation cell comprises a enable terminal capable of receiving a enable signal, wherein the logic state of the output signal is determined by a logic state of the enable signal.

13. The integrated circuit as claimed in claim 12, wherein the isolation cell comprises an AND gate, and the logic state of the enable signal is logic 0.

14. The integrated circuit as claimed in claim 12, wherein the isolation cell comprises an OR gate, and the logic state of the enable signal is logic 1.

15. An integrated circuit, comprising:
    a first power domain powered by a first power source;
    a second power domain powered by a second power source, which is different from the first power source, wherein the first power domain is operated in a power down mode or a power on mode, and the second power domain is operated in a power on mode; and an isolation cell powered by a third power source, capable of receiving a signal from the first power domain and outputting an output signal with a predetermined logic state to the second power domain, wherein the isolation cell is coupled to the first power source and the second power source.

16. The integrated circuit as claimed in claim 15, wherein the isolation cell comprises a enable terminal capable of receiving a enable signal, wherein the logic state of the output signal is determined by a logic state of the enable signal.

17. The integrated circuit as claimed in claim 15, wherein the isolation cell comprises a first power terminal and a second power terminal, the first power terminal is capable of receiving a voltage from the third power source.

18. The integrated circuit as claimed in claim 16, wherein the isolation cell comprises an AND gate, and the logic state of the enable signal is logic 0.

19. The integrated circuit as claimed in claim 16, wherein the isolation cell comprises an OR gate, and the logic state of the enable signal is logic 1.

* * * * *